United States Patent
Mazahreh et al.

(10) Patent No.: US 10,263,644 B1
(45) Date of Patent: Apr. 16, 2019

(54) HYBRID ARCHITECTURE FOR LDPC CHANNEL CODING IN DATA CENTER

(71) Applicant: Xilinx, Inc., San Jose, CA (US)

(72) Inventors: Raied N. Mazahreh, Sandy, UT (US); Hai-Jo Tarn, Saratoga, CA (US); Nihat E. Tunali, Campbell, CA (US); Christopher H. Dick, San Jose, CA (US)

(73) Assignee: XILINX, INC., San Jose, CA (US)

( * ) Notice: Subject to any disclaimer, the term of this patent is extended or adjusted under 35 U.S.C. 154(b) by 60 days.

(21) Appl. No.: 14/925,825

(22) Filed: Oct. 28, 2015

(51) Int. Cl.
*H03M 13/37* (2006.01)
*H03M 13/11* (2006.01)
*G06F 11/10* (2006.01)

(52) U.S. Cl.
CPC ..... *H03M 13/3715* (2013.01); *G06F 11/1076* (2013.01); *H03M 13/1108* (2013.01); *H03M 13/1111* (2013.01)

(58) Field of Classification Search
CPC .. H03M 13/35; H03M 13/353; H03M 13/356; H03M 13/3715
See application file for complete search history.

(56) References Cited

U.S. PATENT DOCUMENTS

| | | | | |
|---|---|---|---|---|
| 5,426,379 A * | 6/1995 | Trimberger | ............... | G06F 5/10 326/38 |
| 8,245,120 B2 * | 8/2012 | Xu | ....................... | H04L 1/0051 714/758 |
| 8,429,498 B1 * | 4/2013 | Anholt | ................ | G06F 11/1048 365/227 |
| 9,092,353 B1 * | 7/2015 | Micheloni | ........... | G06F 11/1008 |
| 2011/0066922 A1 * | 3/2011 | Wezelenburg | ...... | G06F 11/1072 714/773 |
| 2011/0246853 A1 * | 10/2011 | Kim | .................... | G06F 11/1048 714/758 |
| 2012/0119928 A1 * | 5/2012 | Yang | .................. | G06F 11/1012 341/94 |
| 2014/0310580 A1 * | 10/2014 | Zhang | ................ | H03M 13/1111 714/780 |
| 2015/0220389 A1 * | 8/2015 | Kim | ..................... | G06F 11/1048 714/764 |
| 2015/0263760 A1 * | 9/2015 | Hof | .................... | H03M 13/3707 714/758 |

(Continued)

*Primary Examiner* — Steve N Nguyen
(74) *Attorney, Agent, or Firm* — David O'Brien; Carleton Clauss (57) ABSTRACT

Methods and systems are presented in this disclosure for implementing forward error correction in cloud and data center storage devices based on low-density parity-check (LDPC) channel coding. A forward error correction circuit presented herein includes a first LDPC decoder configured to perform hard-decision LDPC decoding of data read from a storage medium through a first read channel. The forward error correction circuit further includes a hybrid LDPC decoder selectively configurable to perform a selected one of hard-decision LDPC decoding and soft-decision LDPC decoding of data read from the storage medium through a second read channel, wherein, responsive to a control signal generated based, at least in part, on one or more parameters indicative of condition of the storage medium, the hybrid LDPC decoder is switchable between hard-decision LDPC decoding and soft-decision LDPC decoding.

20 Claims, 6 Drawing Sheets

(56) References Cited

U.S. PATENT DOCUMENTS

2015/0349807 A1* 12/2015 Vernon ............... H03M 13/353
                                                    714/774
2016/0006459 A1*  1/2016 Hanham ............ H03M 13/1108
                                                    714/764
2016/0006462 A1*  1/2016 Hanham ............ H03M 13/3715
                                                    714/764

* cited by examiner

HYBRID ARCHITECTURE FOR LDPC CHANNEL CODING IN DATA CENTER

TECHNICAL FIELD

The present disclosure generally relates to a hardware design for error correction and, more particularly, to a hybrid architecture for low-density parity-check (LDPC) channel coding.

BACKGROUND

Flash memory based solid state drives (SSDs) are increasingly becoming key elements in a storage hierarchy in cloud and data center applications. Conventional error correction codes (ECCs), such as the commonly used Bose-Chaudhuri-Hocquenghem (BCH) codes, have become increasingly inadequate for SSDs as the capacity of flash memory continues to increase and its reliability continues to degrade as more bits are packed into each memory cell (e.g., in case of three-level cells or, in general, multi-level cells).

Therefore, it is highly desirable to deploy much more powerful ECCs, such as low-density parity-check (LDPC) codes, in order to significantly improve the reliability of SSDs.

SUMMARY

In some embodiments in accordance with the present disclosure, an apparatus comprises a forward error correction circuit, the forward error correction circuit including a first low-density parity-check (LDPC) decoder configured to perform hard-decision LDPC decoding of data read from a storage medium through a first read channel, and the forward error correction circuit further including a hybrid LDPC decoder selectively configurable to perform a selected one of hard-decision LDPC decoding and soft-decision LDPC decoding of data read from the storage medium through a second read channel, wherein, responsive to a control signal generated based, at least in part, on one or more parameters indicative of condition of the storage medium, the hybrid LDPC decoder is switchable between hard-decision LDPC decoding and soft-decision LDPC decoding.

In some embodiments, the forward error correction circuit further includes a second hybrid LDPC decoder selectively configurable to perform a selected one of hard-decision LDPC decoding and soft-decision LDPC decoding of data read from the storage medium through a third read channel, wherein, responsive to another control signal generated based, at least in part, on one or more other parameters indicative of either condition of the storage medium or error correction performance for data read through the third read channel, the second hybrid LDPC decoder is switchable between hard-decision LDPC decoding and soft-decision LDPC decoding.

In some embodiments, hard-decision LDPC decoding paths outnumber soft-decision LDPC decoding paths.

In some embodiments, in a first mode of operation, the first LDPC decoder and the hybrid LDPC decoder concurrently perform hard-decision LDPC decoding, and in a second mode of operation, the hybrid LDPC decoder performs soft-decision LDPC decoding and the first LDPC decoder is not employed for forward error correction.

In some embodiments, for at least some values of the one or more parameters indicative of condition of the storage medium, the control signal disables the first LDPC decoder and selects a soft-decision LDPC decoding mode of the hybrid LDPC decoder. In some embodiments, for at least some other values of the one or more parameters indicative of condition of the storage medium, the control signal enables the first LDPC decoder and selects a hard-decision LDPC decoding mode of the hybrid LDPC decoder.

In some embodiments, the one or more parameters indicative of condition of the storage medium are selected from the set of: a time period elapsed since a last write operation associated with the storage medium, a temperature of an environment associated with the forward error correction circuit or the storage medium, and a number of programming and erase cycles associated with the storage medium.

In some embodiments, the control signal is further based on one or more parameters indicative of error correction performance for data read through either or both of the first and second read channels. In some embodiments, the one or more parameters indicative of error correction performance are selected from the set of: statistics related to the first LDPC decoder and the hybrid LDPC decoder, and a reliability measure for either or both of the first and second read channels. In some embodiments, the statistics characterize a coded bit error rate or a coded frame error rate. In some embodiments, the statistics characterize incidence of a parity check condition or an early termination condition. In some embodiments, the reliability measure characterizes at least one of a read disturb error rate, a data retention error rate, or a program disturb error rate.

In some embodiments, the storage medium is configured as a solid state drive (SSD) device. In some embodiments, the first LDPC decoder and the hybrid LDPC decoder are configured in programmable logic of a field programmable gate array (FPGA). In some embodiments, the first LDPC decoder and the hybrid LDPC decoder are encoded as a design specification loadable as a bitstream into programmable logic of an FPGA.

In some embodiments in accordance with the present disclosure, a method for performing forward error correction includes performing, when a first LDPC decoding path is enabled, hard-decision LDPC decoding of data read from a storage medium through a first read channel, generating a control signal based, at least in part, on one or more parameters indicative of condition of the storage medium, and performing, via a selectively configurable hybrid LDPC decoding path, a selected one of hard-decision LDPC decoding and soft-decision LDPC decoding of data read from the storage medium through a second read channel, wherein, responsive to the control signal, the hybrid LDPC decoding path is switchable between a hard-decision LDPC decoding path and a soft-decision LDPC decoding path.

In some embodiments, the method further includes performing, in a first mode of operation, hard-decision LDPC decoding concurrently via the first LDPC decoding path and the hard-decision LDPC decoding path, and performing, in a second mode of operation, soft-decision LDPC decoding via the soft-decision LDPC decoding path, wherein the first LDPC decoding path is not enabled for forward error correction.

In some embodiments, for at least some values of the one or more parameters indicative of condition of the storage medium, the control signal disables the first LDPC decoding path and selects the soft-decision LDPC decoding path. In some embodiments, for at least some other values of the one or more parameters indicative of condition of the storage medium, the control signal enables the first LDPC decoding path and selects the hard-decision LDPC decoding path.

In some embodiments, the one or more parameters indicative of condition of the storage medium are selected from the set of: a time period elapsed since a last write operation associated with the storage medium, a temperature of an environment associated with at least one of the first LDPC decoding path, the hybrid LDPC decoding path, or the storage medium, and a number of programming and erase cycles associated with the storage medium.

BRIEF DESCRIPTION OF THE FIGURES

Various embodiments of the present disclosure will be understood more fully from the detailed description given below and from the accompanying drawings of various embodiments of the disclosure. In the drawings, like reference numbers may indicate identical or functionally similar elements.

DETAILED DESCRIPTION

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Embodiments of the present disclosure relate to a method and apparatus for performing hard-decision low-density parity-check (LDPC) decoding and soft-decision LDPC decoding. While the present disclosure is described herein with reference to illustrative embodiments for particular applications, it should be understood that embodiments are not limited thereto. Other embodiments are possible, and modifications can be made to the embodiments within the spirit and scope of the teachings herein and additional fields in which the embodiments would be of significant utility.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described. It would also be apparent to one skilled in the relevant art that the embodiments, as described herein, can be implemented in many different embodiments of software, hardware, firmware, and/or the entities illustrated in the figures. Any actual software code with the specialized control of hardware to implement embodiments is not limiting of the detailed description. Thus, the operational behavior of embodiments will be described with the understanding that modifications and variations of the embodiments are possible, given the level of detail presented herein.

Illustrative embodiments and related methods of the present disclosure are described below in reference to FIGS. 1-7 as they might be employed, for example, in a system for performing hard-decision LDPC decoding and soft-decision LDPC decoding. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

The present disclosure describes methods and apparatus for improving costs of implementing LDPC-based coding systems in data center storage devices (e.g., solid state drives (SSDs) and flash memories). LDPC represents an emerging forward error correction scheme of choice for flash memory sub-systems as used in cloud and data center applications. While the coding and error correction capability of LDPC codes are superior to codes like the Bose-Chaudhuri-Hocquenghem (BCH) codes conventionally used in cloud and data center applications, the cost of an LDPC-based coding system is typically significantly higher than that of a BCH-based coding system. Therefore, it is desirable to develop methods and apparatus to reduce implementation costs of the LDPC-based coding system.

One of the unique properties of a flash memory read channel is that channel statistics may change over time. For example, due to a memory wear, a flash memory cell may become less reliable over time as more programming and erase (P/E) cycles are applied. Therefore, in an early life of the flash memory sub-system, the coding strength of an LDPC code is not required. But, as the flash memory ages and becomes less reliable over time, a powerful LDPC coding scheme becomes increasingly valuable for extending a useful life of the flash memory sub-system.

For certain embodiments, LDPC decoding scheme can be based on two different approaches, i.e., on hard-decision LDPC decoding and soft-decision LDPC decoding. In the case of hard-decision LDPC decoding, messages exchanged between variable-nodes and check-nodes of a Tanner graph representing an LDPC code are single bits, i.e., each exchanged message represents a hard decision that a bit of data is either 0 or 1. In the case of soft-decision LDPC decoding, each message exchanged between variable-nodes and check-nodes of the Tanner graph represents conditional probability that a bit of data is 0 or 1 given a particular set of bits (e.g., a set of bits read from a flash memory via a memory read channel).

Figure 1:
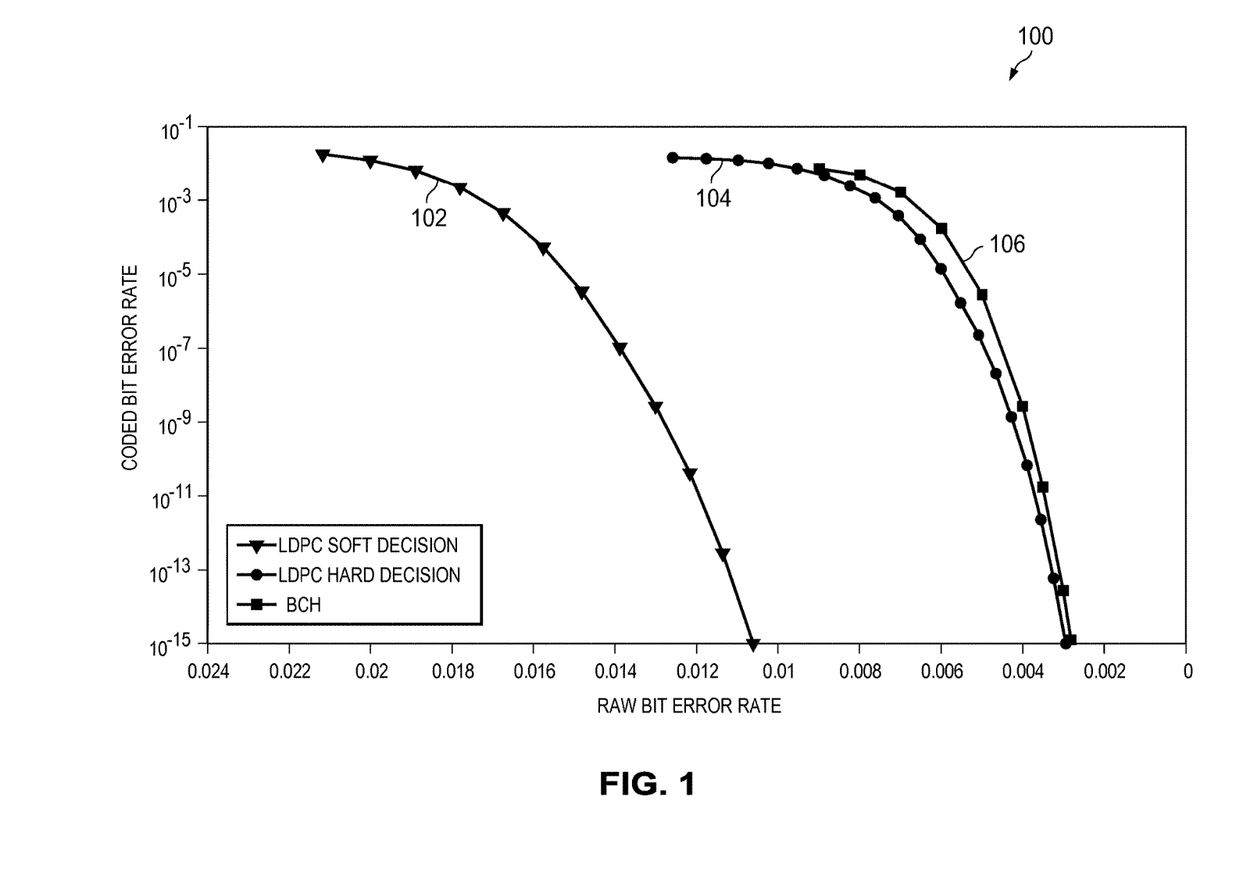
FIG. 1 is a graph illustrating comparison of coding performance of hard-decision low-density parity-check (LDPC) decoding and soft-decision LDPC decoding, according to certain embodiments of the present disclosure.

Although hard-decision LDPC decoding is simpler, error correction capability of hard-decision LDPC decoding is inferior to that of soft-decision LDPC decoding. FIG. 1 illustrates a graph 100 comparing error correction performance (e.g., coded bit error rate (BER)) of BCH decoding, hard-decision LDPC decoding and soft-decision LDPC decoding, according to certain embodiments of the present disclosure. It can be observed from FIG. 1 that, for the same value of raw BER, a coded BER of hard-decision LDPC decoding (plot 104 in FIG. 1) is lower than a coded BER of BCH decoding (plot 106 in FIG. 1). As further illustrated in FIG. 1, a coded BER of soft-decision LDPC decoding (plot 102 in FIG. 1) is several orders of magnitude lower than a coded BER of hard-decision LDPC decoding (plot 104 in FIG. 1), for the same value of raw BER.

Although inferior in terms of error correction performance, hard-decision LDPC decoding has a much lower computational complexity than that of soft-decision LDPC decoding. Hence, design implementation of hard-decision LDPC decoding occupies a substantially smaller hardware area than design implementation of soft-decision LDPC decoding. This is true regardless of whether the hardware implementation of hard-decision and soft-decision LDPC decoding is based on field-programmable gate array (FPGA) design, application-specific integrated circuit (ASIC) design, application-specific standard product (ASSP) design, or some other design.

In one or more embodiments, an LDPC-based decoding process for data read from a storage medium (e.g., a flash memory configured as an SSD device) may be to first engage a hard-decision LDPC decoder configured for performing hard-decision LDPC decoding. Then, if the hard-decision LDPC decoding process fails, then a soft-decision LDPC decoder may be employed for performing soft-decision LDPC decoding. As will be described in further detail below, certain embodiments of the present disclosure support a forward error correction (FEC) system equipped with multiple hard-decision LDPC decoders (hard-decision LDPC decoding channels or paths) and with one or more soft-decision LDPC decoders (soft-decision LDPC decoding channels or paths). For certain embodiments of the present disclosure, hard-decision LDPC decoding paths outnumber soft-decision LDPC decoding paths in an FEC system due to memory bandwidth constraints described in further detail below.

Figure 2:
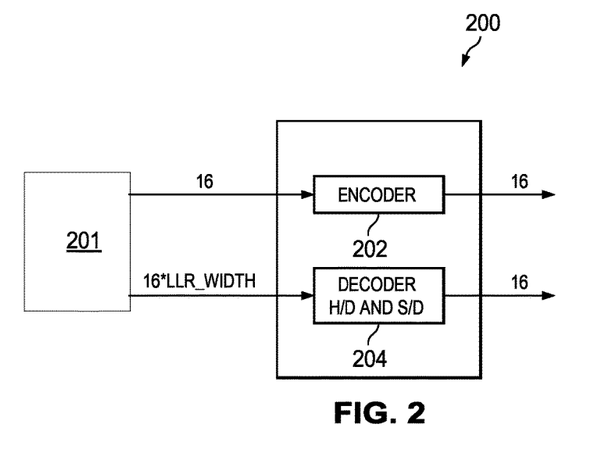
FIG. 2 is a schematic diagram showing an LDPC coding system comprising an LDPC encoder and a hybrid LDPC decoder capable of both hard-decision LDPC decoding and soft-decision LDPC decoding, according to certain embodiments of the present disclosure.

FIG. 2 is a schematic diagram showing an LDPC coding system 200 comprising a single LDPC encoder 202 and a single LDPC decoder 204. LDPC encoder 202 may be configured for LDPC-based data encoding, wherein 16 bits of raw (uncoded) data may be read at a time (e.g., through a read channel) from a buffer coupled to a storage medium 201 (e.g., flash memory, SSD, disk, buffer or other storage) into LDPC encoder 202, and 16 bits of an encoded codeword generated by LDPC encoder 202 may be written at a time (e.g., through a write channel) back into the buffer connected to the storage medium. LDPC decoder 204 of LDPC coding system 200 may be a hybrid LDPC decoder selectively configurable to perform a selected one of hard-decision LDPC decoding and soft-decision LDPC decoding. In one or more embodiments, hybrid LDPC decoder may comprise both hard-decision (H/D) and soft-decision (S/D) LDPC decoding paths, wherein both H/D and S/D decoding paths have a common interface with the buffer connected to the storage medium. A mechanism for switching from H/D decoding path to S/D decoding path within hybrid LDPC decoder is based on certain parameters related, at least in part, to error correcting performance and/or an indication about condition of the storage medium interfaced with the decoding paths, as will be described in further detail below.

As illustrated in FIG. 2, when LDPC decoder 204 is configured for soft-decision LDPC decoding, 16 logarithmic likelihood ratios (LLRs) of conditional bit probabilities may be read at a time from an LLR/soft information generation block connected to the storage medium 201 (e.g., through a read channel) and being processed by LDPC decoder 204; 16 bits of decoded data from LDPC decoder 204 may be written at a time (e.g., through a write channel) into a buffer (e.g., LLR Random Access Memory (RAM)) connected to one or more storage mediums. For certain embodiments, LDPC coding system 200 may achieve a throughput of up to 600 Mbytes/sec. In one or more embodiments, LDPC coding system 200 may be implemented on an FPGA utilizing approximately 21,000 look-up tables (LUTs) and 56 RAMB18K blocks.

Figure 3:
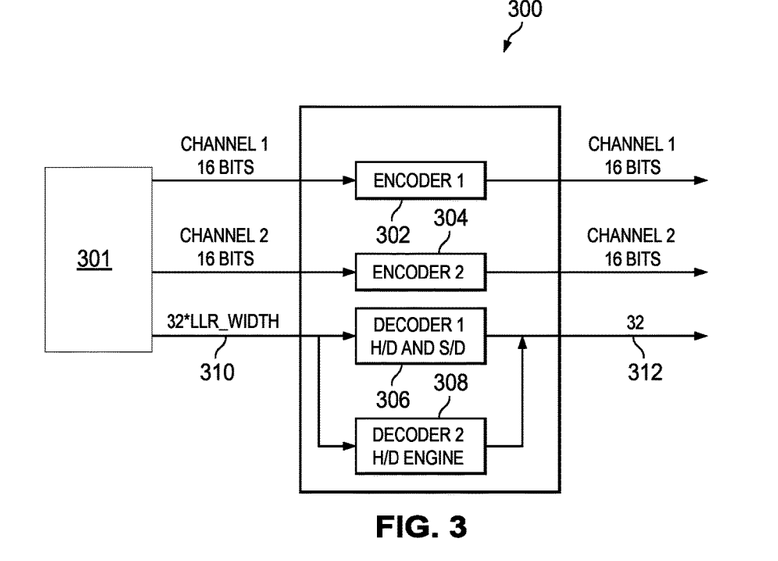
FIG. 3 is a schematic diagram showing an LDPC coding system comprising a plurality of LDPC encoders, a hard-decision LDPC decoder, and a hybrid LDPC decoder capable of both hard-decision LDPC decoding and soft-decision LDPC decoding, according to certain embodiments of the present disclosure.

FIG. 3 is a schematic diagram showing an LDPC coding system 300 comprising a plurality of LDPC encoders 302-304, a hybrid LDPC decoder 306 selectively configurable to perform a selected one of hard-decision LDPC decoding and soft-decision LDPC decoding, and a hard-decision LDPC decoder 308 configured to perform hard-decision LDPC decoding, according to certain embodiments of the present disclosure. As illustrated in FIG. 3, LDPC encoders 302 and 304 may be interfaced with a buffer connected to a storage medium 301 (e.g., flash memorySSD, disk, buffer or other storage) through separate read channels. Each LDPC encoder may be configured for LDPC-based data encoding, where 16 bits of raw (uncoded) data may be read at a time (e.g., through read channel 1 or read channel 2) from buffers connected to the storage medium into that LDPC encoder (LDPC encoder 302 or LDPC encoder 304). After LDPC-based encoding is performed, 16 bits of an encoded codeword may be written at a time (e.g., through write channel 1 or write channel 2) into a writing buffer, and then written back to the storage medium 301.

As further illustrated in FIG. 3, LDPC coding system 300 may comprise LDPC decoder 308 capable of performing hard-decision LDPC decoding of data read from a storage medium 301 through a first read channel. LDPC coding system 300 may further comprise a hybrid LDPC decoder 306 selectively configurable to perform a selected one of hard-decision LDPC decoding and soft-decision LDPC decoding of data read from the storage medium 301 through a second read channel. For certain embodiments, as illustrated in FIG. 3, 32 LLRs of conditional bit probabilities (e.g., data 310 in FIG. 3) may be read at a time from an LLR/soft information generation block connected to the storage medium 301 (e.g., through one or more read channels) into hybrid LDPC decoder 306 and/or hard-decision LDPC decoder 308; 32 bits of encoded data 312 from hybrid LDPC decoder 306 and/or hard-decision LDPC decoder 308 may be written at a time (e.g., through one or more write channels) into a buffer or a memory (e.g., LLR RAM) connected to the storage medium 301.

In one or more embodiments, hard-decision LDPC decoder 308 and hybrid LDPC decoder 306 may concurrently perform hard-decision LDPC decoding of data 310 read from the LLR/soft information generation block connected to the storage medium 301 through one or more memory read channels. In this case, data 310 may comprise hard (individual) bits related to hard decision. In an embodiment, memory read operation of individual bits for hard-decision LDPC decoding may have a latency of, for example, less than 100 μsec. If, for certain reasons that will be described in further detail below, operation of hard-decision LDPC decoding concurrently performed by hard-decision LDPC decoder 308 and hybrid LDPC decoder 306 is not satisfactory, then hard-decision LDPC decoder 308 may not be employed for forward error correction (e.g., hard-decision LDPC decoder 308 may be disabled), and hybrid LDPC decoder 306 may switch its operation to soft-decision LDPC decoding. Data generated from the previously performed hard-decision LDPC decoding may be stored in a buffer connected to the storage medium 301, prepared for soft-decision LDPC decoding, pipelined and read back into hybrid LDPC decoder 306 configured for soft-decision LDPC decoding. In this case, soft data (i.e., conditional bit probabilities) 310 may be read from the LLR/soft information generation block connected to the storage medium 301 into hybrid LDPC decoder 306 for conducting soft-decision LDPC decoding operation.

For certain embodiments, memory read operation of soft data required for soft-decision LDPC decoding may last longer than memory read operation of hard data required for hard-decision LDPC decoding. This is because more time is required to prepare soft data for soft-decision LDPC decoding, and multiple bits are read from the storage medium into the LLR/soft information generation block sequentially to generate LLR or soft information. In one or more embodiments, memory read operation of soft data required for soft-decision LDPC decoding may have a latency of, for example, approximately 300 μsec-500 μsec, which is substantially longer than the latency of memory read operation associated with hard-decision LDPC decoding (e.g., the memory read latency of hard data is less than 100 μsec).

In one or more embodiments, LDPC coding system 300 illustrated in FIG. 3 may comprise a plurality of hard-decision LDPC decoders 308 configured to concurrently perform hard-decision LDPC decoding operations. For certain embodiments, LDPC coding system 300 may comprise multiple hybrid LDPC decoders 306, each hybrid LDPC decoder 306 selectively configurable to perform a selected one of hard-decision LDPC decoding and soft-decision LDPC decoding. A shorter latency of memory read operation of hard information (hard data) required for hard-decision LDPC decoding compared to the latency of memory read operation of soft data required for soft-decision LDPC decoding may allow to configure LDPC coding system 300 such that to have a larger number of hard-decision LDPC decoding paths operating concurrently than soft-decision LDPC decoding paths operating concurrently. In one or more embodiments, as illustrated in FIG. 3, LDPC coding system 300 may comprise two hard-decision LDPC decoding paths operating concurrently (e.g., one decoding path within hard-decision LDPC decoder 308 and one decoding path within hybrid LDPC decoder 306 configured for hard-decision LDPC decoding) and one soft-decision LDPC decoding path (e.g., a decoding path within hybrid LDPC decoder 306 configured for soft-decision LDPC decoding). In general, operating concurrently a larger number of hard-decision LDPC decoding paths than soft-decision LDPC decoding paths is supported in LDPC coding system because of a shorter latency of memory read operation of hard information required for hard-decision LDPC decoding compared to a latency of memory read operation of soft information required for soft-decision LDPC decoding.

For certain embodiments, LDPC coding system 300 may comprise multiple hard-decision LDPC decoding paths operating concurrently, e.g., decoding path of hard-decision LDPC decoder 308 operating concurrently with hard-decision decoding path of hybrid LDPC decoder 306. When certain conditions are met as will be described in further detail below, LDPC coding system 300 may be configured to switch from concurrently operating multiple hard-decision LDPC decoding paths to operating a single soft-decision LDPC decoding path (e.g., within hybrid LDPC decoder 306), while utilizing the same interface with the storage medium. A smaller number of soft-decision LDPC decoding paths in comparison with a number of hard-decision LDPC decoding paths of LDPC coding system 300 may be due a bandwidth constraint of the storage medium, i.e., a latency of read operation of soft information from the storage medium required for soft-decision LDPC decoding is substantially larger than a latency of read operation of hard information from the storage medium required for hard-decision LDPC decoding.

In one or more embodiments, multiple LDPC decoders may concurrently perform hard-decision LDPC decoding (e.g., hybrid LDPC decoder 306 and hard-decision LDPC decoder 308), which may be followed by switching operation of LDPC coding system 300 to soft-decision LDPC decoding performed by a single soft-decision decoding path within hybrid LDPC decoder 306. Thus, LDPC coding system 300 may support multiplicity of hard-decision LDPC decoding channels (paths), but operating only a single soft-decision LDPC decoding channel (path) due to, at least in part, bandwidth constraints of the storage medium 301 interfaced with hybrid LDPC decoder 306 when soft data (e.g., LLR bit probabilities) are read from the storage medium 301 into hybrid LDPC decoder 306.

In one or more embodiments, LDPC decoder 308 and hybrid LDPC decoder 306 may concurrently perform hard-decision LDPC decoding, and a control signal may be generated based on one or more parameters monitored during these concurrent hard-decision LDPC decoding operations. In one or more other embodiments, only hybrid LDPC decoder 306 may perform forward error correction based on soft-decision LDPC decoding, and a control signal may be generated based on one or more parameters monitored during this soft-decision LDPC decoding operation. For certain embodiments, the one or more parameters may be indicative of condition of the storage medium 301. In an embodiment, for at least some values of the one or more parameters indicative of condition of the storage medium 301, the control signal may disable hard-decision LDPC decoder 308 for forward error correction and may select a soft-decision LDPC decoding mode of hybrid LDPC decoder 306. In another embodiment, for at least some other values of the one or more parameters indicative of condition of the storage medium 301, the control signal may enable hard-decision LDPC decoder 308 and may select a hard-decision LDPC decoding mode of hybrid LDPC decoder 306.

In one or more embodiments, the one or more parameters indicative of condition of the storage medium 301 may comprise at least one of: a time period elapsed since a last memory write operation associated with the storage medium 301 interfaced with LDPC decoders 306-308, an ambient temperature of an environment associated with LDPC coding system 300 or the storage medium 301, or a number of P/E cycles associated with the storage medium 301. For example, if the time period elapsed since the last memory write operation is below a certain threshold period, the ambient temperature is not above a specific upper bound, and the number of P/E cycles is smaller than a defined value, then the control signal generated based on the monitored one or more parameters may configure LDPC coding system 300 for concurrent hard-decision LDPC decoding operations by hard-decision LDPC decoder 308 and hybrid LDPC decoder 306. In other words, in an early life of the storage medium 301 (e.g., a flash memory configured as an SSD device) and when circuitry operates under normal ambient (e.g., temperature) conditions, hard-decision LDPC decoding may be a preferred forward error correction operation. In one or more other embodiments, if the time period elapsed since the last memory write operation is greater than the threshold period, the ambient temperature is above the specific upper bound, or the number of P/E cycles is greater than the defined value, then the control signal generated based on the monitored one or more parameters may disable hard-decision LDPC decoder 308 and enable hybrid LDPC decoder 306 to perform soft-decision LDPC decoding. In other words, in a later life of the storage medium 301 (e.g., SSD device configured as flash memory) and/or when circuitry operates under higher temperature conditions, soft-decision LDPC decoding may be a preferred forward error correction operation of LDPC coding system 300.

For certain embodiments, the control signal may be further based on one or more parameters indicative of error correction performance related to hard-decision LDPC decoder 308 and/or hybrid LDPC decoder 306. The one or more parameters indicative of error correction performance may comprise at least one of: statistics at output(s) of hard-decision LDPC decoder 308 and/or hybrid LDPC decoder 306, or a reliability measure of read channel(s) interfacing hard-decision LDPC decoder 308 and/or hybrid LDPC decoder 306 with the storage medium 301. In an embodiment, the statistics may characterize a coded bit error rate or a coded frame error rate. For example, if at least one of the coded bit error rate or the coded frame error rate is above a pre-defined threshold value (i.e., if error correction performance are not satisfactory), hard-decision LDPC decoder 308 may be disabled and hybrid LDPC decoder 306 may be configured for soft-decision LDPC decoding. In another embodiment, the statistics may characterize incidence of a parity check condition or an early termination condition. For example, if the parity check condition and/or the early termination condition are satisfied during hard-decision LDPC decoding, hard-decision LDPC decoder 308 and hybrid LDPC decoder 306 may continue performing concurrent hard-decision LDPC decoding operations. Otherwise, hard-decision LDPC decoder 308 may be disabled and hybrid LDPC decoder 306 may be configured to perform soft-decision LDPC decoding operation. In one or more other embodiments, the reliability measure may characterize at least one of: a read disturb error rate, a data retention error rate, or a program disturb error rate of the storage medium 301. For example, if at least one of the read disturb error rate, the data retention error rate, or the program disturb error rate is above a specific threshold error rate (i.e., condition of the storage medium 301 is not satisfactory), hard-decision LDPC decoder 308 may be disabled and hybrid LDPC decoder 306 may be configured to perform soft-decision LDPC decoding operation.

It should be noted that when both hybrid LDPC decoder 306 and hard-decision LDPC decoder 308 concurrently perform hard-decision LDPC decoding operations (e.g., prior to hybrid LDPC decoder 306 switches its operation to soft-decision LDPC decoding and hard-decision LDPC decoder 308 is disabled), a throughput of LDPC coding system 300 may be twice as a throughput of LDPC coding system 200 illustrated in FIG. 2. For certain embodiments, LDPC coding system 300 illustrated in FIG. 3 may achieve a throughput of up to 1200 Mbytes/sec. In one or more embodiments, LDPC coding system 300 may be implemented on an FPGA utilizing approximately 30,000 LUTs and 81 RAMB18K blocks. Therefore, while the throughput of LDPC coding system 300 from FIG. 3 may be doubled in comparison with the throughput of LDPC coding system 200 from FIG. 2, implementation cost (e.g., area size) of LDPC coding system 300 is only approximately 50% larger than implementation cost (e.g., area size) of LDPC coding system 200.

Figure 4:
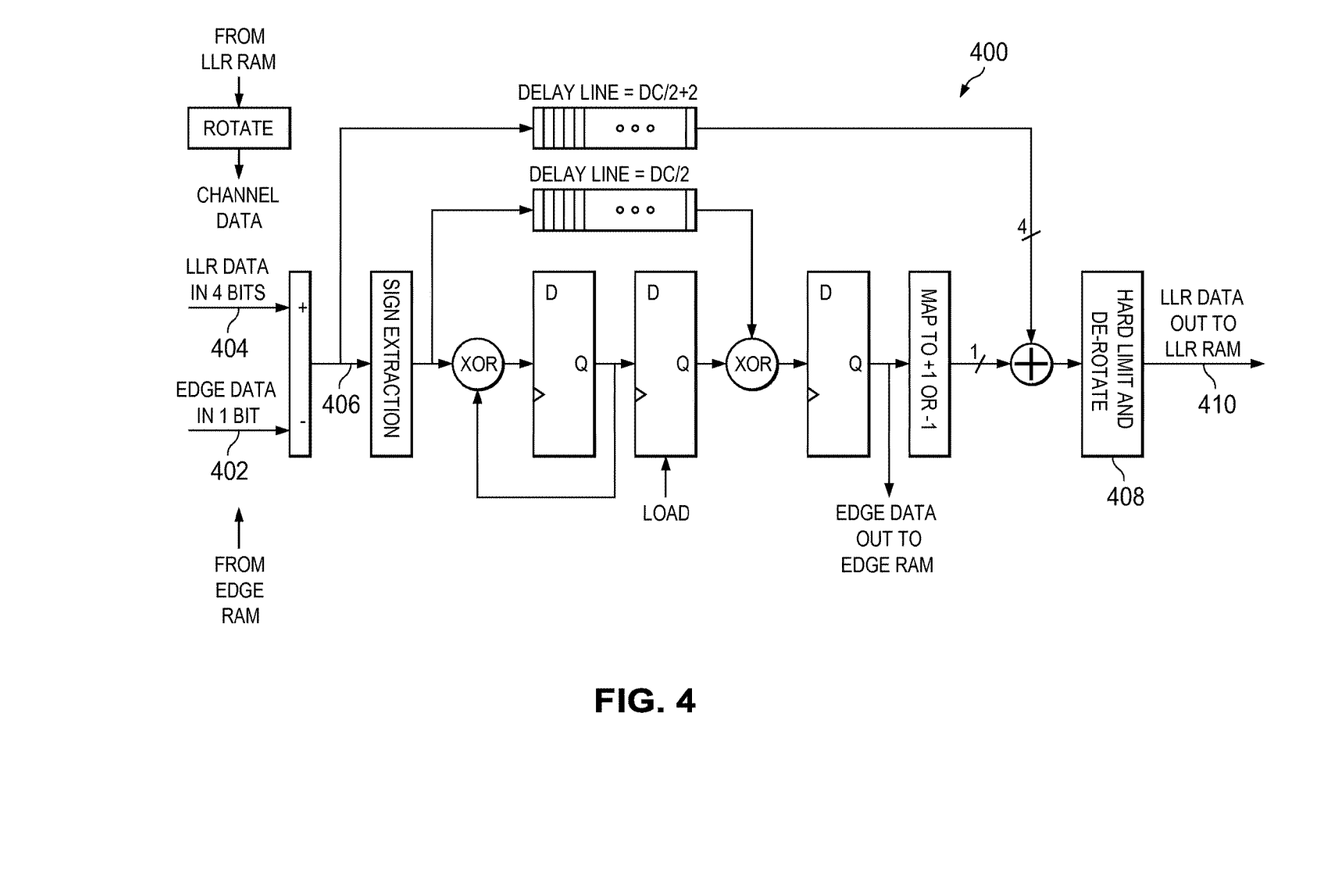
FIG. 4 is a block diagram of a hard-decision LDPC decoder, according to certain embodiments of the present disclosure.

FIG. 4 illustrates an example block diagram 400 of a hard-decision LDPC decoder, according to certain embodiments of the present disclosure. In one or more embodiments, block diagram 400 of the hard-decision LDPC decoder may comprise a micro-architecture implemented inside LDPC decoder engine 308 illustrated in FIG. 3 configured to perform hard-decision LDPC decoding. As illustrated in FIG. 4, input data 402 from a storage medium (e.g., an edge data memory) is one bit wide, input LLR data 404 may be four bits wide, and an internal bus 406 of hard-decision LDPC decoder engine 400 may be designed to have a width of four bits. In one or more embodiments, the width of internal bus 406 is designed to support bit growth that may occur during LDPC decoding operations of hard-decision LDPC decoder engine 400. As further illustrated in FIG. 4, a hard limit and de-rotate block 408 of hard-decision LDPC decoder 400 may be configured to generate output LLR data 410 that are written into a storage medium such as LLR Random Access Memory (LLR RAM). In an embodiment, the output LLR data 410 may comprise hard-decision LLRs, each LLR 410 being one bit wide (i.e., each LLR 410 is a single bit representing hard decision information).

Figure 5:
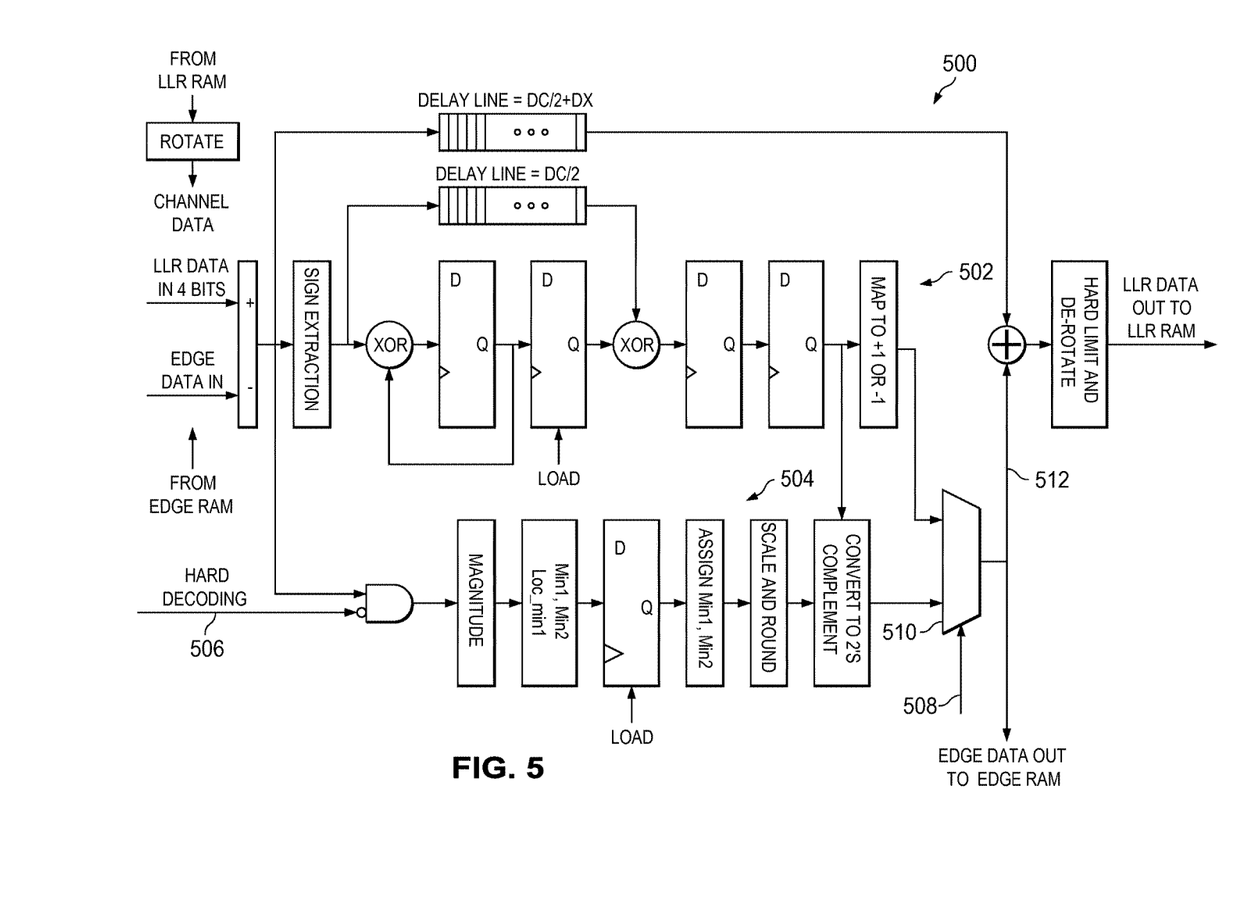
FIG. 5 is a block diagram of a hybrid LDPC decoder configured for both hard-decision LDPC decoding and soft-decision LDPC decoding, according to certain embodiments of the present disclosure.

FIG. 5 illustrates an example block diagram 500 of a hybrid LDPC decoder selectively configurable to perform a selected one of hard-decision LDPC decoding and soft-decision LDPC decoding, according to certain embodiments of the present disclosure. In one or more embodiments, block diagram 500 of the hybrid LDPC decoder capable of performing both hard-decision and soft-decision LDPC decoding may comprise a micro-architecture implemented inside hybrid LDPC decoder 204 from FIG. 2 and hybrid LDPC decoder 306 from FIG. 3. As illustrated in FIG. 5, a decoding path 502 within hybrid LDPC decoder 500 may be configured for performing hard-decision LDPC decoding, and may correspond to the decoding path of hard-decision LDPC decoder 400 illustrated in FIG. 4.

As further illustrated in FIG. 5, a decoding path 504 within hybrid LDPC decoder 500 may be configured for performing soft-decision LDPC decoding operation. In one or more embodiments, hybrid LDPC decoder 500 from FIG. 5 may initially perform hard-decision LDPC decoding through decoding path 502 concurrently with hard-decision LDPC decoding performed by hard-decision LDPC decoder 400 from FIG. 4. For some embodiments, as discussed, one or more parameters indicative of condition of a storage medium interfaced with hybrid LDPC decoder 500 and/or error correction performance of hybrid LDPC decoder 500 may be monitored during concurrent hard-decision LDPC decoding operations of hybrid LDPC decoder 500 and hard-decision LDPC decoder 400 from FIG. 4. Based on the monitored one or more parameters, hard-decision LDPC decoder 400 may be disabled and hybrid LDPC decoder 500 may switch its operation from decoding path 502 to decoding path 504, i.e., hybrid LDPC decoder 500 may switch its operation from hard-decision LDPC decoding to soft-decision LDPC decoding. For certain embodiments, a control signal 506 (e.g., a bit signal) may be generated based on the monitored one or more parameters. Control signal 506 may initiate switching operation of hybrid LDPC decoder 500 from decoding path 502 to decoding path 504, i.e., from hard-decision LDPC decoding to soft-decision LDPC decoding. A select signal (e.g., a single bit) 508 of a multiplexer 510 may be related to control signal 506 and may select an output from a corresponding decoding path into an internal bus 512 and into LLR RAM (e.g., from soft-decision LDPC decoding path 504 when hybrid LDPC decoder 500 switches its operation from hard-decoding to soft-decoding). Thus, in one or more embodiments, select signal 508 may be also generated based on the monitored one or more parameters. For some embodiments, control signal 506 may further initiate (e.g., based on some of the monitored one or more parameters) switching operation of hybrid LDPC decoder 500 from decoding path 504 to decoding path 502, i.e., from soft-decision LDPC decoding back to hard-decision LDPC decoding. In this case, when hard-decision LDPC decoding is employed within hybrid LDPC decoder 500, control signal 506 may disable decoding path 504, and select signal 508 may select an output from hard-decision LDPC decoding path 502.

In one or more embodiments, a width of internal bus 512 of hybrid LDPC decoder 500 may be designed to support both hard-decision and soft-decision LDPC decoding. Hence, the width of internal bus 512 may be larger than the width of internal bus 406 of hard-decision LDPC decoder 400 from FIG. 4. In an embodiment, the width of internal bus 512 may be six bits in order to support accurate soft-decision LDPC decoding utilizing decoding path 504 of hybrid LDPC decoder 500.

Figure 6:
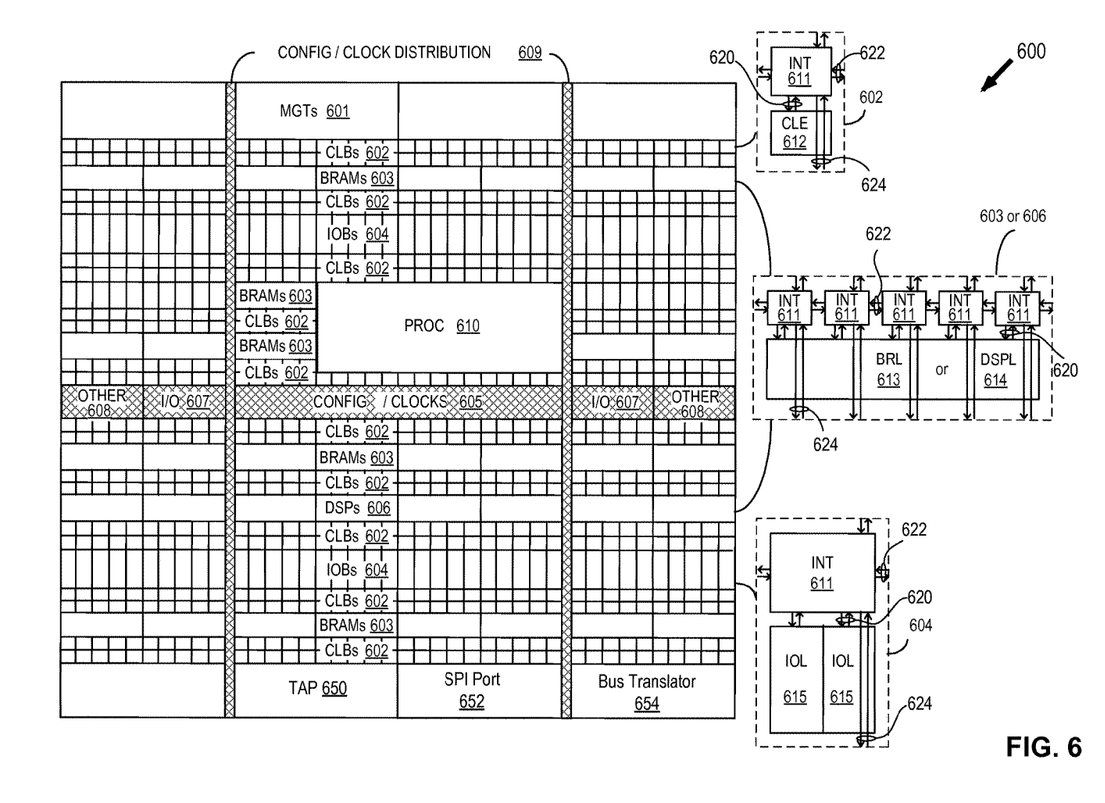
FIG. 6 is a schematic of a field programmable gate array architecture (FPGA) on which embodiments of the present disclosure can be implemented.

FIG. 6 illustrates an example FPGA architecture 600 in which embodiments of the presented disclosure can be implemented. For certain embodiments, LDPC coding system 300 illustrated in FIG. 3 may be implemented on the FPGA 600. In one or more embodiments, hard-decision LDPC decoder 400 illustrated in FIG. 4 and hybrid LDPC decoder 500 illustrated in FIG. 5 may be implemented on the FPGA 600.

FPGA architecture 600 includes a large number of different programmable tiles including multi-gigabit transceivers ("MGTs") 601, configurable logic blocks ("CLBs") 602, random access memory blocks ("BRAMs") 603, input/output blocks ("IOBs") 604, configuration and clocking logic ("CONFIG/CLOCKS") 605, digital signal processing blocks ("DSPs") 606, specialized input/output blocks ("I/O") 607 (e.g., configuration ports and clock ports), and other programmable logic 608 such as digital clock managers, analog-to-digital converters, system monitoring logic, and so forth. Some FPGAs also include dedicated processor blocks ("PROC") 610.

In some FPGAs, each programmable tile can include at least one programmable interconnect element ("INT") 611 having connections to input and output terminals 620 of a programmable logic element within the same tile, as shown by examples included at the top of FIG. 6. Each programmable interconnect element 611 can also include connections to interconnect segments 622 of adjacent programmable interconnect element(s) in the same tile or other tile(s). Each programmable interconnect element 611 can also include connections to interconnect segments 624 of general routing resources between logic blocks (not shown). The general routing resources can include routing channels between logic blocks (not shown) comprising tracks of interconnect segments (e.g., interconnect segments 624) and switch blocks (not shown) for connecting interconnect segments. The interconnect segments of the general routing resources (e.g., interconnect segments 624) can span one or more logic blocks. The programmable interconnect elements 611 taken together with the general routing resources implement a programmable interconnect structure ("programmable interconnect") for the illustrated FPGA.

In an example implementation, a CLB 602 can include a configurable logic element ("CLE") 612 that can be programmed to implement user logic plus a single programmable interconnect element ("INT") 611. A BRAM 603 can include a BRAM logic element ("BRL") 613 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 606 can include a DSP logic element ("DSPL") 614 in addition to an appropriate number of programmable interconnect elements. An 10B 604 can include, for example, two instances of an input/output logic element ("IOL") 615 in addition to one instance of the programmable interconnect element 611. As will be clear to those of skill in the art, the actual I/O pads connected, for example, to the I/O logic element 615 typically are not confined to the area of the input/output logic element 615.

In the pictured example, a horizontal area near the center of the die (shown in FIG. 6) is used for configuration, clock, and other control logic. Vertical columns 609 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 610 spans several columns of CLBs and BRAMs.

The processor block 610 can various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. Moreover, the FPGA of FIG. 6 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements.

The FPGA 600 can include a TAP 650 to provide a JTAG interface and an SPI port 652 to provide an SPI interface. The FPGA 600 can include a bus translator 654 to provide an interface between the JTAG and SPI interfaces. In one example, the bus translator 654 comprises a dedicated circuit formed alongside the FPGA 600. In another example, at least a portion of the bus translator 654 can be configured using programmable logic of the FPGA 600.

Figure 7:
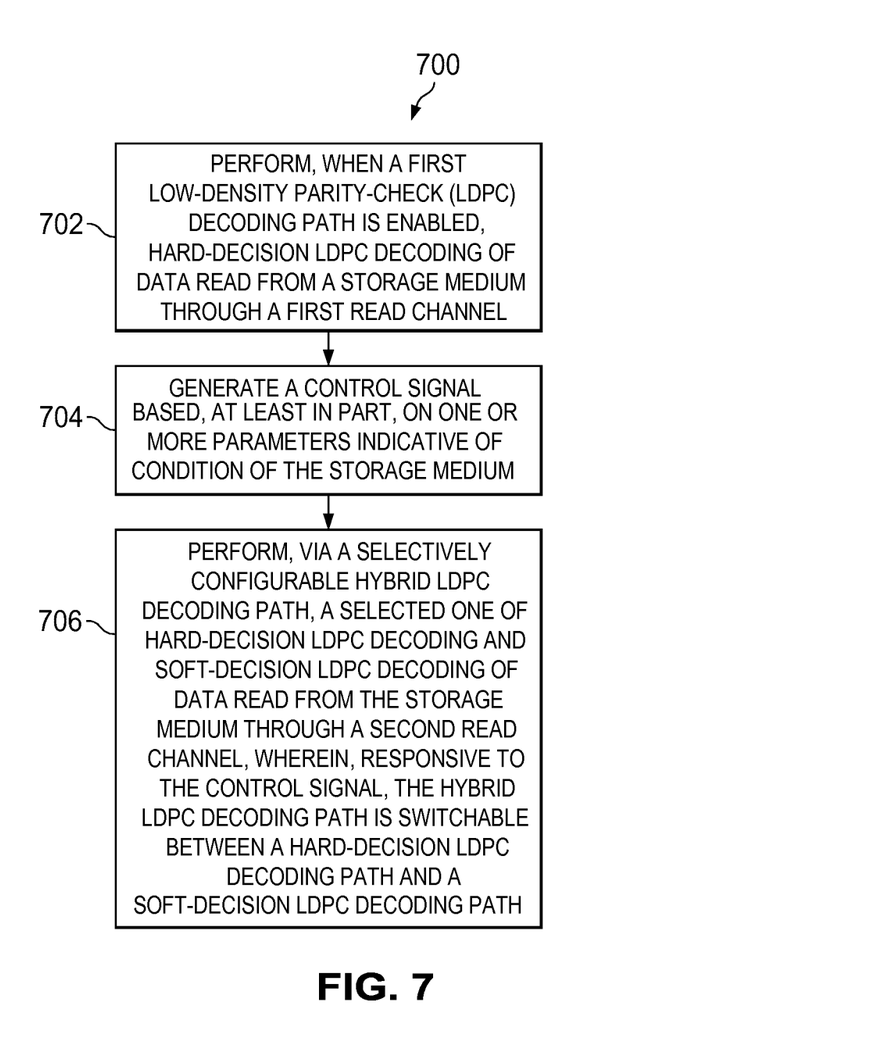
FIG. 7 is a flow chart illustration of a method for performing hard-decision LDPC decoding and soft-decision LDPC decoding, according to certain embodiments of the present disclosure.

Discussion of an illustrative method of the present disclosure will now be made with reference to FIG. 7, which is a flow chart illustration of a method 700 for performing hard-decision LDPC decoding and soft-decision LDPC decoding, according to certain embodiments of the present disclosure. The method begins at 702, by performing, when a first LDPC decoding path is enabled (e.g., hard-decision LDPC decoding path 400 illustrated in FIG. 4), hard-decision LDPC decoding of data read from a storage medium through a first read channel. At 704, a control signal (e.g., control signal 506 of hybrid LDPC decoder 500 illustrated in FIG. 5) may be generated based, at least in part, on one or more parameters indicative of condition of the storage medium. At 706, it may be performed, via a selectively configurable hybrid LDPC decoding path (e.g., hybrid LDPC decoding path 500 illustrated in FIG. 5), a selected one of hard-decision LDPC decoding and soft-decision LDPC decoding of data read from the storage medium through a second read channel, wherein, responsive to the control signal, the hybrid LDPC decoding path may be switchable between a hard-decision LDPC decoding path (e.g., decoding path 502 illustrated in FIG. 5) and a soft-decision LDPC decoding path (e.g., decoding path 504 illustrated in FIG. 5). In one or more embodiments, as discussed, hard-decision LDPC decoding paths outnumber soft-decision LDPC decoding paths due to storage medium bandwidth constraints.

In one or more embodiments, the one or more parameters indicative of condition of the storage medium may be selected from the set of: a time period elapsed since a last write operation associated with the storage medium, a temperature of an environment associated with the forward error correction circuit or the storage medium, and a number of P/E cycles associated with the storage medium. For certain other embodiments, the control signal may be further based on one or more parameters indicate of error correction performance for data read through either or both of the first and second read channels. The one or more parameters indicative of error correction performance may be selected from the set of: statistics related to the first LDPC decoder and the hybrid LDPC decoder, and a reliability measure for either or both of the first and second read channels. In an embodiment, the statistics may characterize a coded bit error rate or a coded frame error rate. In another embodiment, the statistics may characterize incidence of a parity check condition or an early termination condition. In yet another embodiment, the reliability measure may characterize at least one of: a read disturb error rate, a data retention error rate, or a program disturb error rate.

Embodiments of the present disclosure relate to implementation of circuitry for forward error correction. In one or more embodiments, the circuitry for forward error correction may be implemented on the FPGA 600 illustrated in FIG. 6. The circuitry for forward error correction may comprise a first LDPC decoder (e.g., hard-decision LDPC decoder 308 from FIG. 3, hard-decision LDPC decoder 400 from FIG. 4) configured to perform hard-decision LDPC decoding of data read from a storage medium through a first read channel, and a hybrid LDPC decoder (e.g., hybrid LDPC decoder 306 from FIG. 3, hybrid LDPC decoder 500 from FIG. 5) selectively configurable to perform a selected one of hard-decision LDPC decoding and soft-decision LDPC decoding of data read from the storage medium through a second read channel, wherein, responsive to a control signal generated based, at least in part, on one or more parameters indicative of condition of the storage medium, the hybrid LDPC decoder is switchable between hard-decision LDPC decoding and soft-decision LDPC decoding.

Although embodiments have been described largely in connection with exemplary SSD, disk or flash memory-type storage, persons of ordinary skill in the art having benefit of the present disclosure will appreciate a wide variety of additional storage that may be used in connection with embodiments of the present invention(s). For example, and without limitation, storage media may include NAND flash or other forms of non-volatile memory, SSD-type or magnetic or optical disk media devices or arrays, tape, etc. directly or indirectly coupled to the LDPC decoder(s), as well as buffers associated with information transfers to, from or via communication networks, on- or off-chip, and/or in system interconnect fabrics.

For certain embodiments, the forward error correction circuitry further includes a second hybrid LDPC decoder (e.g., hybrid LDPC decoder 306 from FIG. 3, hybrid LDPC decoder 500 from FIG. 5) selectively configurable to perform a selected one of hard-decision LDPC decoding and soft-decision LDPC decoding of data read from the storage medium through a third read channel, wherein, responsive to another control signal generated based, at least in part, on one or more other parameters indicative of either condition of the storage medium or error correction performance for data read through the third read channel, the second hybrid LDPC decoder is switchable between hard-decision LDPC decoding and soft-decision LDPC decoding.

For certain embodiments, in a first mode of operation of the forward error correction circuitry, the first LDPC decoder and the hybrid LDPC decoder concurrently perform hard-decision LDPC decoding. In a second mode of operation of the forward error correction circuitry, the hybrid LDPC decoder performs soft-decision LDPC decoding and the first LDPC decoder is not employed for forward error correction.

For some embodiments, the storage medium may be configured as a SSD device. For some other embodiments, the storage medium may include flash memory. In one or more embodiments, the first LDPC decoder (e.g., hard-decision LDPC decoder 308 from FIG. 3, hard-decision LDPC decoder 400 from FIG. 4) and the hybrid LDPC decoder (e.g., hybrid LDPC decoder 306 from FIG. 3, hybrid LDPC decoder 500 from FIG. 5) are configured in programmable logic of an FPGA. In one or more other embodiments, the first LDPC decoder and the hybrid LDPC decoder are encoded as a design specification loadable as a bitstream into programmable logic of an FPGA.

The various examples described herein may employ various computer-implemented operations involving data stored in computer systems. For example, these operations may require physical manipulation of physical quantities—usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more example implementations may be useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including handheld devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system—computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a Compact Disc (CD)-ROM, a CD-R, or a CDRW, a DVD (Digital Versatile Disc), a magnetic tape, and other optical and non-optical data storage devices. The computer readable medium can also be distributed over a network coupled computer system so that the computer readable code is stored and executed in a distributed fashion.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. An apparatus, comprising:
   a forward error correction circuit including:
      a first low-density parity-check (LDPC) decoder configured to perform hard-decision LDPC decoding of data read from a storage medium through a first read channel, and
      a hybrid LDPC decoder selectively configurable to perform a selected one of hard-decision LDPC decoding and soft-decision LDPC decoding of data read from the storage medium through a second read channel different from the first read channel,
   wherein, responsive to a control signal, the hybrid LDPC decoder is switchable between hard-decision LDPC decoding and soft-decision LDPC decoding, and
   wherein the control signal is generated based on a first parameter indicative of error correction performance related to the first LDPC decoder and first data from the first read channel and a second parameter indicative of error correction performance related to the hybrid LDPC decoder and second data read through the second read channel after the first LDPC decoder and the hybrid LDPC decoder concurrently perform hard-decision LDPC decoding to the first data and second data respectively,
   wherein the forward error correction circuit is configured to buffer previously performed hard-decision LDPC decoded data generated by the first LDPC decoder and the hybrid LDPC decoder, prepare the previously performed hard-decision LDPC decoded data for soft-decision LDPC decoding, and read back the prepared soft-decision LDPC decoding data to the hybrid LDPC decoder for soft-decision LDPC decoding.

2. The apparatus of claim 1, wherein hard-decision LDPC decoding paths outnumber soft-decision LDPC decoding paths.

3. The apparatus of claim 1, wherein the forward error correction circuit further includes a second hybrid LDPC decoder selectively configurable to perform one of hard-decision LDPC decoding and soft-decision LDPC decoding of data read from the storage medium through a third read channel, wherein, responsive to another control signal generated based, at least in part, on one or more other parameters indicative of either condition of the storage medium or error correction performance for data read through the third read channel, the second hybrid LDPC decoder is switchable between hard-decision LDPC decoding and soft-decision LDPC decoding.

4. The apparatus of claim 1, wherein:
   in a first mode of operation, the first LDPC decoder and the hybrid LDPC decoder concurrently perform hard-decision LDPC decoding; and
   in a second mode of operation, the hybrid LDPC decoder performs soft-decision LDPC decoding and the first LDPC decoder is not employed for forward error correction.

5. The apparatus of claim 1, wherein for at least some values of the first and second parameters, the control signal disables the first LDPC decoder and selects a soft-decision LDPC decoding mode of the hybrid LDPC decoder.

6. The apparatus of claim 5, wherein for at least some other values of the first and second parameters, the control signal enables the first LDPC decoder and selects a hard-decision LDPC decoding mode of the hybrid LDPC decoder.

7. The apparatus of claim 1, wherein the control signal is further based on a third parameter indicative of condition of the storage medium.

8. The apparatus of claim 7, wherein the third parameter indicative of condition of the storage medium is selected from the set of:
   a time period elapsed since a last write operation associated with the storage medium,
   a temperature of an environment associated with the forward error correction circuit or the storage medium, and
   a number of programming and erase cycles associated with the storage medium.

9. The apparatus of claim 1, wherein the second parameter indicative of error correction performance is selected from the set of:
   statistics related to the hybrid LDPC decoder, and
   a reliability measure for second read channel.

10. The apparatus of claim 9, wherein the statistics characterize a coded bit error rate or a coded frame error rate.

11. The apparatus of claim 9, wherein the statistics characterize incidence of a parity check condition or an early termination condition.

12. The apparatus of claim 9, wherein the reliability measure characterizes at least one of:
a read disturb error rate,
a data retention error rate, or
a program disturb error rate.

13. The apparatus of claim 1, wherein the storage medium is configured as a solid state drive (SSD) device.

14. The apparatus of claim 1, wherein the first LDPC decoder and the hybrid LDPC decoder are configured in programmable logic of a field programmable gate array (FPGA).

15. The apparatus of claim 1, wherein the first LDPC decoder and the hybrid LDPC decoder are encoded as a design specification loadable as a bitstream into programmable logic of a field programmable gate array (FPGA).

16. A method for performing forward error correction, the method comprising:
performing, when a first low-density parity-check (LDPC) decoding path is enabled, hard-decision LDPC decoding of first data read from a storage medium through a first read channel;
performing, using a hybrid LDPC decoding path, hard-decision LDPC decoding of second data read from the storage medium through second read channel different from the first read channel concurrently with the first hard-decision LDPC decoding of the first data;
generating a control signal based on a first parameter indicative of error correction performance related to the first LDPC decoding path and the first data through the first read channel and a second parameter indicative of error correction performance related to the hybrid LDPC decoding path and the second data through the second read channel;
buffering previously performed hard-decision LDPC encoded data generated by the first LDPC decoder and the hybrid LDPC decoder;
preparing the previously performed hard-decision LDPC decoded data for soft-decision LDPC decoding;
reading back the prepared soft-decision LDPC decoding data to the hybrid LDPC decoder for soft-decision LDPC decoding; and
performing, via the hybrid LDPC decoding path, soft-decision LDPC decoding of the prepared soft-decision LDPC decoding data, wherein, responsive to the control signal, the hybrid LDPC decoding path is switchable between a hard-decision LDPC decoding path and a soft-decision LDPC decoding path.

17. The method of claim 16, further comprising:
performing, in a first mode of operation, hard-decision LDPC decoding concurrently via the first LDPC decoding path and the hard-decision LDPC decoding path; and
performing, in a second mode of operation, soft-decision LDPC decoding via the soft-decision LDPC decoding path, wherein the first LDPC decoding path is not enabled for forward error correction.

18. The method of claim 16, wherein for at least some values of the first and second parameters, the control signal disables the first LDPC decoding path and selects the soft-decision LDPC decoding path.

19. The method of claim 18, wherein for at least some other values of the first and second parameters, the control signal enables the first LDPC decoding path and selects the hard-decision LDPC decoding path.

20. The method of claim 16, wherein the control signal is based on a third parameter indicative of condition of the storage medium selected from the set of:
a time period elapsed since a last write operation associated with the storage medium,
a temperature of an environment associated with at least one of the first LDPC decoding path, the hybrid LDPC decoding path, or the storage medium, and
a number of programming and erase cycles associated with the storage medium.

* * * * *